United States Patent
Chun et al.

(10) Patent No.: US 7,816,687 B2
(45) Date of Patent: Oct. 19, 2010

(54) DRIVING TRANSISTOR AND ORGANIC LIGHT EMITTING DIODE DISPLAY HAVING THE SAME

(75) Inventors: Pil Geun Chun, Suwon-si (KR); Woong Sik Choi, Gyeonggi-do (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 0 days.

(21) Appl. No.: 11/280,958

(22) Filed: Nov. 15, 2005

(65) Prior Publication Data

US 2006/0154422 A1   Jul. 13, 2006

(30) Foreign Application Priority Data

Nov. 17, 2004   (KR) ..................... 10-2004-0094182

(51) Int. Cl.
*H01L 27/15* (2006.01)

(52) U.S. Cl. ................ 257/72; 257/59; 257/E27.12

(58) Field of Classification Search .......... 257/E31.113, 257/59, 72, E27.12–E27.121, 57, 64, 66
See application file for complete search history.

(56) References Cited

U.S. PATENT DOCUMENTS

| | | | |
|---|---|---|---|
| 6,372,612 B1 * | 4/2002 | Ito et al. ............. | 438/486 |
| 6,603,453 B2 * | 8/2003 | Yamazaki et al. .......... | 345/92 |
| 2002/0043662 A1 * | 4/2002 | Yamazaki et al. ........... | 257/72 |
| 2002/0084746 A1 * | 7/2002 | Anzai .................. | 313/504 |
| 2003/0209737 A1 * | 11/2003 | Mitani et al. ............. | 257/241 |
| 2003/0227262 A1 * | 12/2003 | Kwon .............. | 315/169.3 |
| 2004/0023449 A1 * | 2/2004 | Hsu et al. ............. | 438/152 |
| 2004/0119101 A1 * | 6/2004 | Schrom et al. ............ | 257/206 |
| 2004/0126940 A1 * | 7/2004 | Inoue ................. | 438/149 |
| 2005/0161738 A1 * | 7/2005 | Hiramatsu et al. .......... | 257/347 |
| 2005/0285108 A1 * | 12/2005 | Choi ................. | 257/59 |

FOREIGN PATENT DOCUMENTS

| | | |
|---|---|---|
| JP | HEI 05-235339 | 10/1993 |
| JP | 11-251444 | 9/1999 |
| KR | 10-1999-019498 | 3/1999 |

* cited by examiner

*Primary Examiner*—Matthew W Such
(74) *Attorney, Agent, or Firm*—Knobbe, Martens, Olson & Bear LLP

(57) ABSTRACT

Embodiments of a transistor capable of outputting uniform driving current despite deviations in manufacturing processes, and an organic light emitting diode display (OLED) capable of displaying high picture quality by employing the transistor are disclosed. The transistor comprises a semiconductor layer formed on a substrate and including a source connected to a source electrode through first and second contacts, a drain connected to a drain electrode through third and fourth contacts, a channel formed between the source and the drain. The transistor further comprises a gate aligned with the channel with a gate insulating layer interposed between the gate and the channel. The first to fourth contacts are formed along different parallel axes which are perpendicular to a direction along which a laser beam proceeds during transistor manufacture.

10 Claims, 9 Drawing Sheets

DRIVING TRANSISTOR AND ORGANIC LIGHT EMITTING DIODE DISPLAY HAVING THE SAME

CROSS-REFERENCE TO RELATED APPLICATIONS

This application claims the benefit of Korean Patent Application No. 10-2004-94182, filed on Nov. 17, 2004, in the Korean Intellectual Property Office, the disclosure of which is incorporated herein by reference in its entirely.

BACKGROUND

1. Field of the Invention

The present invention relates to a transistor and an organic light emitting diode display, and more particularly, to a transistor that produces a driving current with high uniformity despite deviations in manufacturing processes, and an organic light emitting diode display employing the transistor.

2. Discussion of Related Technology

Organic light emitting diode displays (OLEDs) are emissive displays that electrically excite fluorescent or phosphorescent organic compounds to emit light. OLEDs have been identified as next generation displays that can advantageously be driven with low voltage, and the displays can be thin with a wide viewing angle and fast response speed, thereby solving problems associated with liquid crystal displays (LCD).

Figure 1A:
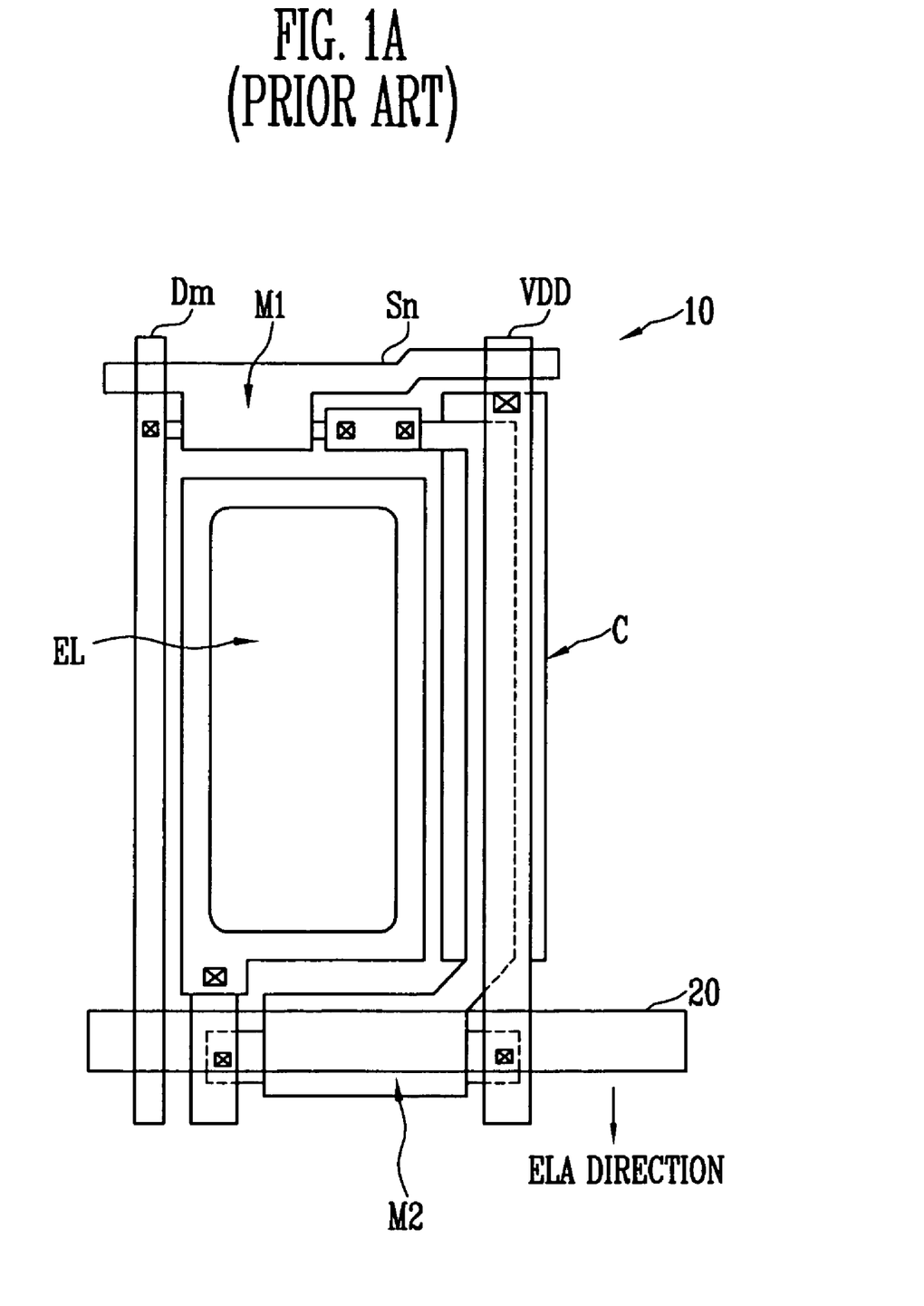
FIG. 1A is a layout diagram of an exemplary pixel.
Figure 1B:
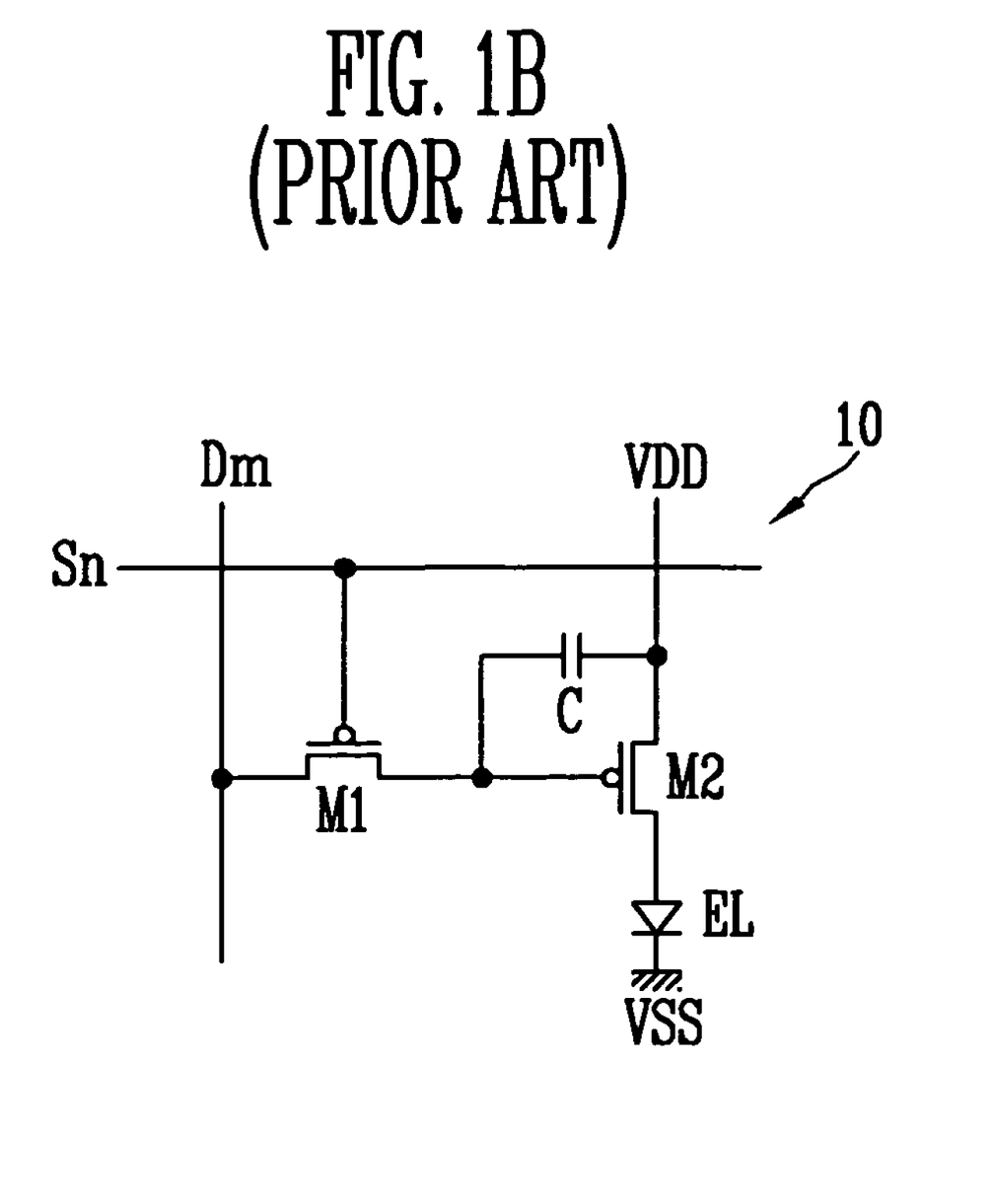
FIG. 1B is a circuit diagram of the pixel illustrated in FIG. 1A.

OLEDs are classified into active matrix (AM) (hereinafter, referred to as "active driving") OLEDs and passive matrix (PM) OLEDs according to the driving method employed. An exemplary active driving OLED is illustrated in FIGS. 1A and 1B, wherein each pixel 10 includes two thin film transistors (TFT) M1 and M2 and a storage capacitor C. The two TFTs M1 and M2 function as a switching transistor M1 configured to control the operations of the pixels, and a driving transistor M2 configured to drive an electroluminescent (EL) device.

The driving transistor M2 includes a drain region and a source region formed by doping a substrate with high concentration impurities, a semiconductor layer having a channel region formed between the drain region and the source region, a gate insulating layer formed on the semiconductor layer, and a gate electrode formed on the channel region of the semiconductor layer with the gate insulating layer interposed. The driving transistor M2 further comprises a drain electrode and a source electrode positioned on the gate electrode and connected to the drain region and the source region through contact holes, with an inter-insulating layer interposed.

During manufacture, the semiconductor layer of the driving transistor M2 is crystallized by a laser beam 20 that proceeds in a first direction. This process may generate a high concentration defect in the source region or the drain region connected to the contact holes of the driving transistor M2. The defect part may be generated due to unexpected non-uniform distribution of energy in laser beams of nearly the same timing. The high concentration defect prevents current flow from the source region to the drain region. Thus, deviations in the driving transistor manufacturing processes result in reduced uniformity in the current transmission characteristics of driving transistors.

In some OLEDs, various compensating circuits are employed to prevent picture quality deterioration and to improve display uniformity. However, when compensating circuits are employed in the OLED, the complexity of the pixels is increased, numerical aperture (NA) deteriorates, and yield of the OLED is reduced.

SUMMARY OF CERTAIN INVENTIVE EMBODIMENTS

One embodiment of a transistor comprises current paths formed therein by a plurality of channel regions to maintain uniformity of current flow. One embodiment of an organic light emitting diode display includes the transistor to realize high picture quality.

One embodiment of a transistor comprises a substrate a semiconductor layer formed on the substrate and having a source connected to a source electrode through first and second contacts, a drain connected to a drain electrode through third and fourth contacts, and a channel formed between the source and the drain. The transistor further comprises a gate aligned opposite the channel with a gate insulating layer interposed, wherein the first to fourth contacts are formed along different parallel axes which are perpendicular to a direction along which a laser beam proceeds during transistor manufacture.

In some embodiments, the channel extends between at least one of the first and second source contacts and at least one of the first and second drain contacts. In certain embodiments, the source extends between the first and second source contacts and/or the drain extends between the first and second drain contacts. In some embodiments, one of a first distance between the first and second source contacts and a second distance between the first and second drain contacts is smaller than the other.

In one embodiment, at least one of the source and drain is connected to at least one of the source electrode and the drain electrode through a fifth contact. In some embodiments, the sources and the drains are connected to the source electrode and the drain electrode, respectively, through at least a fifth contact and at least a sixth contact, wherein the fifth contact and the sixth contact are formed along different parallel axes which are perpendicular to the direction in which the laser beam proceeds.

In one embodiment, the semiconductor layer is a polysilicon layer formed by a process of crystallizing an amorphous silicon layer. In some embodiments, the semiconductor layer is a polysilicon layer formed by an excimer laser annealing process.

One embodiment of an organic light emitting diode display (OLED) comprises an image display part comprising a plurality of pixels, each pixel comprising a driving transistor configured to control the driving of a pixel. The OLED further comprises a scan driver configured to transmit scan signals to scanning lines electrically connected to the plurality of pixels, and a data driver configured to transmit data signals to data lines electrically connected to the plurality of pixels. The driving transistor comprises a substrate, a semiconductor layer formed on the substrate and having a source connected to first and second source contacts of a source electrode through first and second contact holes, a drain connected to first and second drain contacts of a drain electrode through third and fourth contact holes, and a channel formed between the source and the drain. The transistor further comprises a gate electrode aligned opposite the channel with a gate insulating layer interposed. At least one of the first and second source contacts and at least one of the first and second drain contacts are positioned on along different parallel axes which are perpendicular to a direction along which a laser beam proceeds during transistor manufacture.

DETAILED DESCRIPTION OF CERTAIN INVENTIVE EMBODIMENTS

The following detailed description is directed to certain specific embodiments of the invention. However, the invention can be embodied in a multitude of different ways as defined and covered by the claims. In this description, reference is made to the drawings wherein like parts are designated with like numerals throughout.

Figure 2:
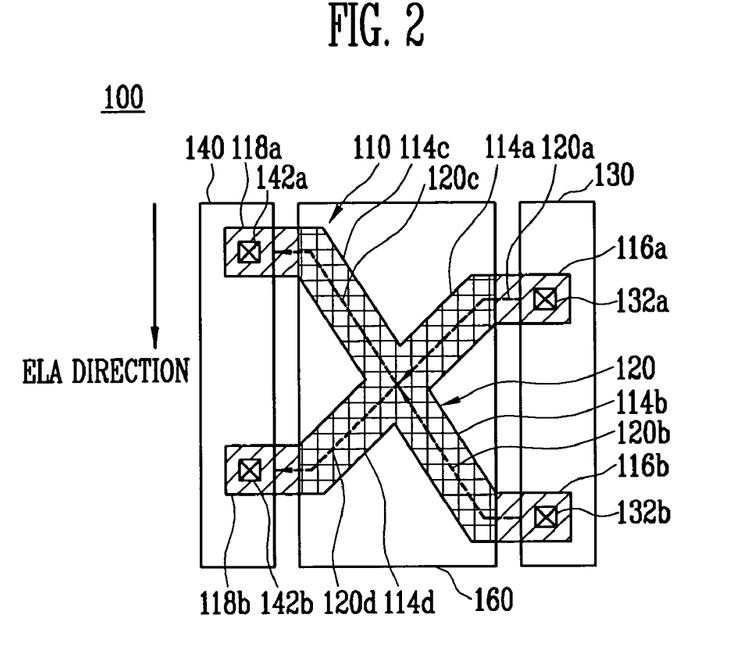
FIG. 2 is a plan view of one embodiment of a transistor.

FIG. 2 is a plan view of one embodiment of a transistor 100. Referring to FIG. 2, the transistor 100 is configured to maintain uniform current flow despite deviations in transistor manufacturing. The transistor 100 comprises a semiconductor layer 110 comprising a channel 120 with four channel regions 114a, 114b, 114c, and 114d in a substantially X-shaped formation. The transistor 100 further comprises first and second source regions 116a and 116b and first and second drain regions 118a and 118b connected to the ends of the channel regions 114a, 114b, 114c, and 114d, respectively. The transistor 100 further includes a gate electrode 160 aligned with (opposite to on its respective layer) the channel 120, and a gate insulating layer (not shown) interposed between their respective layers.

The first and second source regions 116a, 116b of the semiconductor layer 110 are connected to a source electrode 130 through first and second contacts 132a, 132b. Similarly, the first and second drain regions 118a, 118b of the semiconductor layer 110 are connected to a drain electrode 140 through third and fourth contacts 142a, 142b.

In one embodiment, the semiconductor layer 110 is formed so that the source regions 116a, 116b and drain regions 118a, 118b are connected to the ends of the X-shaped channel 120. As illustrated in FIG. 2, the first and second contacts 132a, 132b and the third and fourth contacts 142a, 142b are arranged on the same plane on different parallel axes, which are perpendicular to an ELA scan direction, wherein a laser beam for crystallizing the semiconductor layer 110 proceeds along the ELA scan direction. In the embodiment illustrated in FIG. 2, a first line passes through one of the first and second contacts 132a, 132b and one of the third and fourth contacts 142a, 142b, and a second line is parallel to the laser beam scan direction.

The semiconductor layer 110 includes first, second, third, and fourth current paths 120a, 120b, 120c, 120d through the first, second, third, and fourth channel regions 114a, 114b, 114c, 114d. As illustrated in FIG. 2, the first current path 120a is the current path from the first source region 116a to the center of the channel 120. The second current path 120b is the current path from the second source region 116b to the center of the channel 120. The third current path 120c is the current path from the center of the channel 120 to the first drain region 118a. The fourth current path 120d is the current path from the center of the channel 120 to the second drain region 118b.

Thus, in the semiconductor layer 110, the plurality of current paths are generated in the channel 120 between the source regions 116a, 116b and the drain regions 118a, 118b in the diagonal direction when a predetermined voltage is applied to the gate electrode 160.

Figure 3:
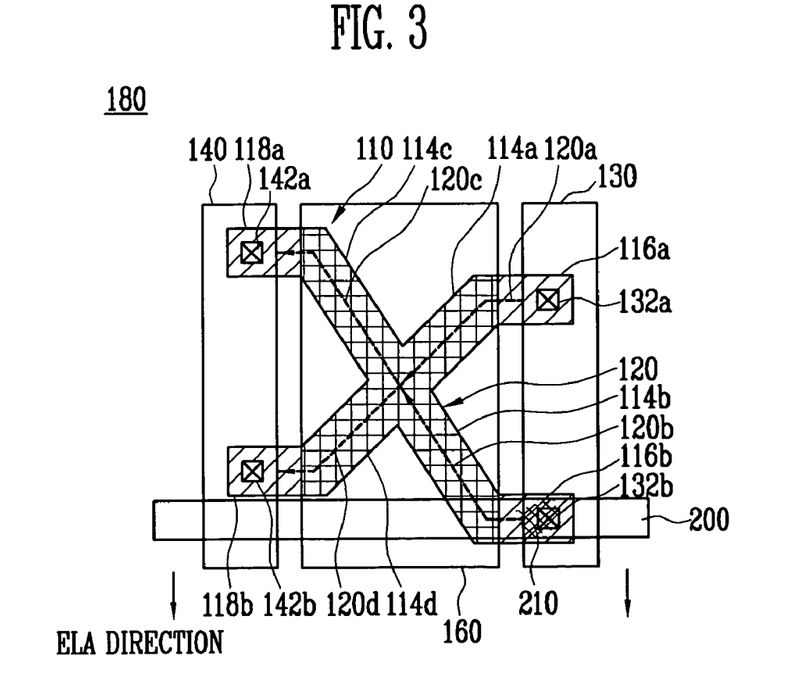
FIG. 3 is a plan view illustrating a defect formed in the channel of an embodiment of a transistor.

FIG. 3 is a plan view of one embodiment of a transistor 180 with a defect formed in a channel of the transistor. Referring to FIG. 3, the transistor 180 is a thin film transistor (TFT). The transistor 180 includes the semiconductor layer 110 formed of polycrystalline silicon, crystallized by an excimer laser annealing (ELA) process. Because polycrystalline silicon has a much smaller surface defect than amorphous silicon, the operation speed of the transistor is about 100 to 200 times faster.

However, the crystallization of the semiconductor layer 110 is affected by pulse-to-pulse stability of a laser beam 200 used in the ELA process. Specifically, in the laser annealing process for crystallizing polycrystalline silicon, the characteristics of poly-TFTs formed in a display panel are non-uniform due to the difference between the product of the laser beam-irradiation and the laser beam 200 for crystallizing polycrystalline silicon and the non-uniform distribution of energy in the laser beam 200.

When a multi-mode laser beam is used in the ELA process, an unexpected change in the energy density of the laser beam during the crystallizing process results in deterioration of the crystallization of the semiconductor layer 120 in a region where a change in the energy density of the laser beam occurs.

Thus, similar to conventional poly-TFTs, the driving transistor 180 may have a region where crystallization deteriorates due to a change in the energy density of the laser beam during the process of crystallizing polycrystalline silicon. This defect may prohibit current flow in the channel and thereby cause the transistor to operate improperly.

For example, as illustrated in FIG. 3, a defect 210 may be generated in the second source region 116b during the process of crystallizing the semiconductor layer 110 of the transistor 180. However, in the transistor 180, the source regions 116a, 116b and the drain regions 118a, 118b are arranged along different, parallel axes which are perpendicular to the ELA scan direction. Particularly, as the laser beam 200 proceeds along the ELA scan direction, the source regions 116a, 116b and the drain regions 118a, 118b are not crystallized by the laser beam 200 simultaneously because they are on different, parallel axes with respect to the ELA scan direction. Thereby, generation of the defect 210 in both of the source and drain regions is prevented and the current paths are formed through the remaining source or drain region, even when the defect 210 is generated. Thus, despite the generation of the defect 210 in the second source region 116b, the transistor 100 maintains uniform current flow using current paths 120a, 120c, and 120d, and combinations thereof.

As described above, even when the defect is generated in a specific region of a channel due to non-uniformities in the transistor manufacturing process, the transistor 180 maintains uniform current flow, thereby improving uniformity of transistors in a display panel. Furthermore, picture quality of display devices comprising pixel circuits with the transistors is also improved.

Figure 4A:
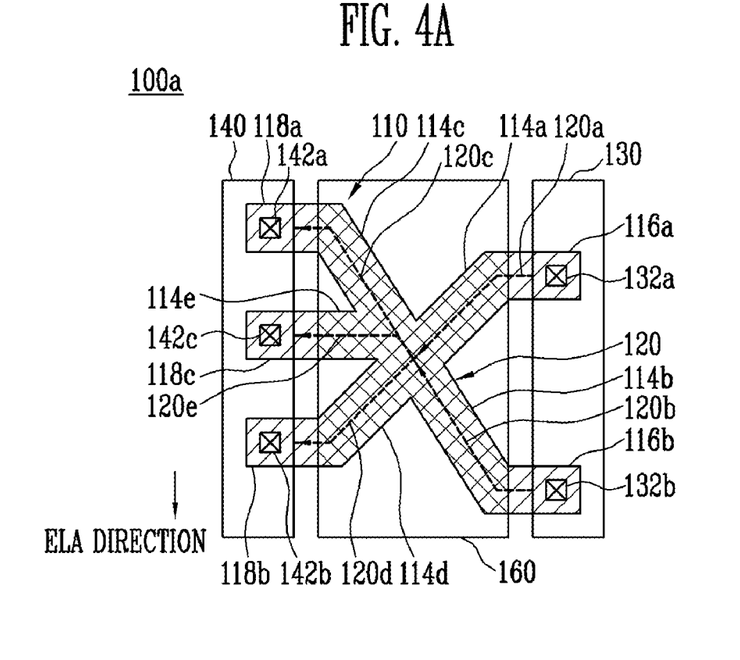
FIGS. 4A-4C are plan views illustrating additional embodiments of a transistor.
Figure 4B:
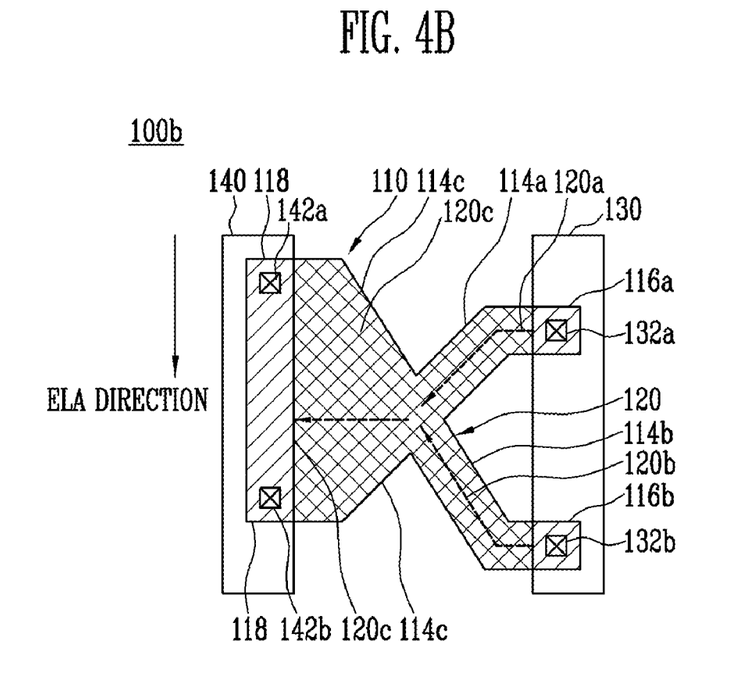
Figure 4C:
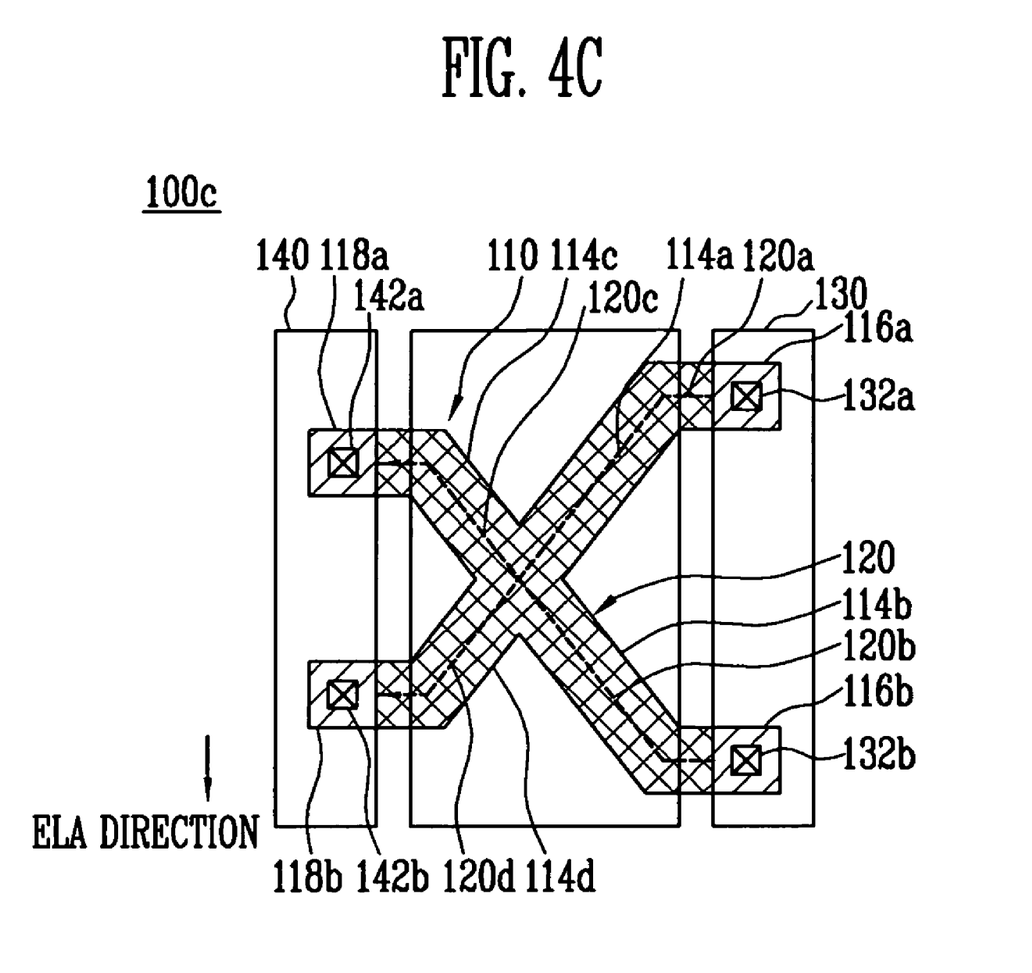

FIGS. 4A to 4C are plan views of additional embodiments of transistors with channel modifications. Features of the transistors illustrated in FIGS. 4A-4C are similar to those illustrated in FIG. 2, and therefore a detailed description of such features is omitted. Referring to FIG. 4A, a transistor 100a comprises a semiconductor layer 110 having a channel 120, wherein the channel 120 comprises five channel regions 114a, 114b, 114c, 114d, and 114e. The transistor 100a further comprises first and second source regions 116a, 116b, and first, second, and third drain regions 118a, 118b, 118c connected to the ends of the channel regions 114a, 114b, 114c, 114d, 114e, respectively. The transistor 100a further includes a gate electrode 160 aligned with the channel 120, and an insulating layer (not shown) interposed between the gate electrode 160 and the channel 120.

The first and second source regions 116a, 116b of the semiconductor layer 110 are connected to the source electrode 130 through first and second contacts 132a and 132b. Similarly, the first, second, and third drain regions 118a, 118b, 118c of the semiconductor layer 110 are connected to the drain electrode 140 through third, fourth, and fifth contacts 142a, 142b, and 142c. In the transistor 100a, the semiconductor layer 110 is formed so that the first and second contacts 132a, 132b and the third to fifth contacts 142a, 142b, 142c are arranged along different, parallel axes which are perpendicular to the ELA scan direction for crystallization of the semiconductor layer 110.

The semiconductor layer 110 further comprises first, second, third, fourth, and fifth current transmission paths 120a, 120b, 120c, 120d, 120e and combinations thereof. In the transistor 100a, in the event a defect is generated in one of the current paths 120a, 120b, 120c, 120d, 120e and/or a specific region of the source regions 116a, 116b and drain regions 118a, 118b, 118c, current paths may still be formed through the other regions, thereby maintaining uniform current flow.

Alternatively, the positions of the source regions and the drain regions in the semiconductor layer 110 may be reversed. In such an embodiment, the transistor 100a is formed so that first, second, and third source regions 118a, 118b, 118c are connected to a source electrode 140 through first, second, and third contacts 142a, 142b, 142c, and first and second drain regions 116a, 116b are connected to a drain electrode 130 through fourth and fifth contacts 132a, 132b.

Referring to FIG. 4B, a transistor 100b comprises a semiconductor layer 110 having a channel 120 comprising three channel regions 114a, 114b, 114c. The semiconductor layer 110 further comprises first and second source regions 116a, 116b connected to the ends of the first and second channel regions 114a, 114b, respectively, and a drain region 118 connected to the end of the third channel region 114c. In one embodiment, the third channel region 114c is wider than the first and second channel regions 114a, 114b. The transistor 100b further comprises the gate electrode 160 aligned with the channel 120, and an insulating layer interposed between the gate electrode 160 and the channel 120.

The first and second source regions 116a, 116b of the semiconductor layer 110 are connected to the source electrode 130 through the first and second contacts 132a, 132b. The drain region 118 of the semiconductor layer 110 is connected to the drain electrode 140 through the third and fourth contacts 142a, 142b.

In the transistor 100b, the semiconductor layer 110 is formed such that the ELA laser beam does not simultaneously cross one of the first and second contacts 132a, 132b and one of the third and fourth contacts 142a, 142b when the laser beam proceeds in the ELA direction during crystallization of semiconductor layer 110.

The semiconductor layer 110 further includes the first, second, and third current paths 120a, 120b, 120c, and combinations thereof between the first and second source regions 116a, 116b and the drain region 118.

Alternatively, the transistor 100b may be modified so as to include two drain regions 116a, 116b and one source region 118. When the transistor includes two drain regions, the two contacts 132a, 132b are formed to connect to one source region and are arranged along different, parallel axes than the two contacts 142a and 142b connected to the drain 118, wherein the different, parallel axes are perpendicular to the ELA scan direction such that the rectangular section of the laser beam does not simultaneously cross a source contact and a drain contact.

FIG. 4C is a layout diagram of one embodiment of a transistor 100c that is substantially the same as the transistor 100 illustrated in FIG. 2, excluding the difference that the distance between the third and fourth contacts 118a, 118b is smaller than the distance between the first and second contacts 116a, 116b. As the features of the transistor 100c are similar to those described above in reference to the transistor 100 of FIG. 2, a detailed description thereof is omitted.

Figure 5:
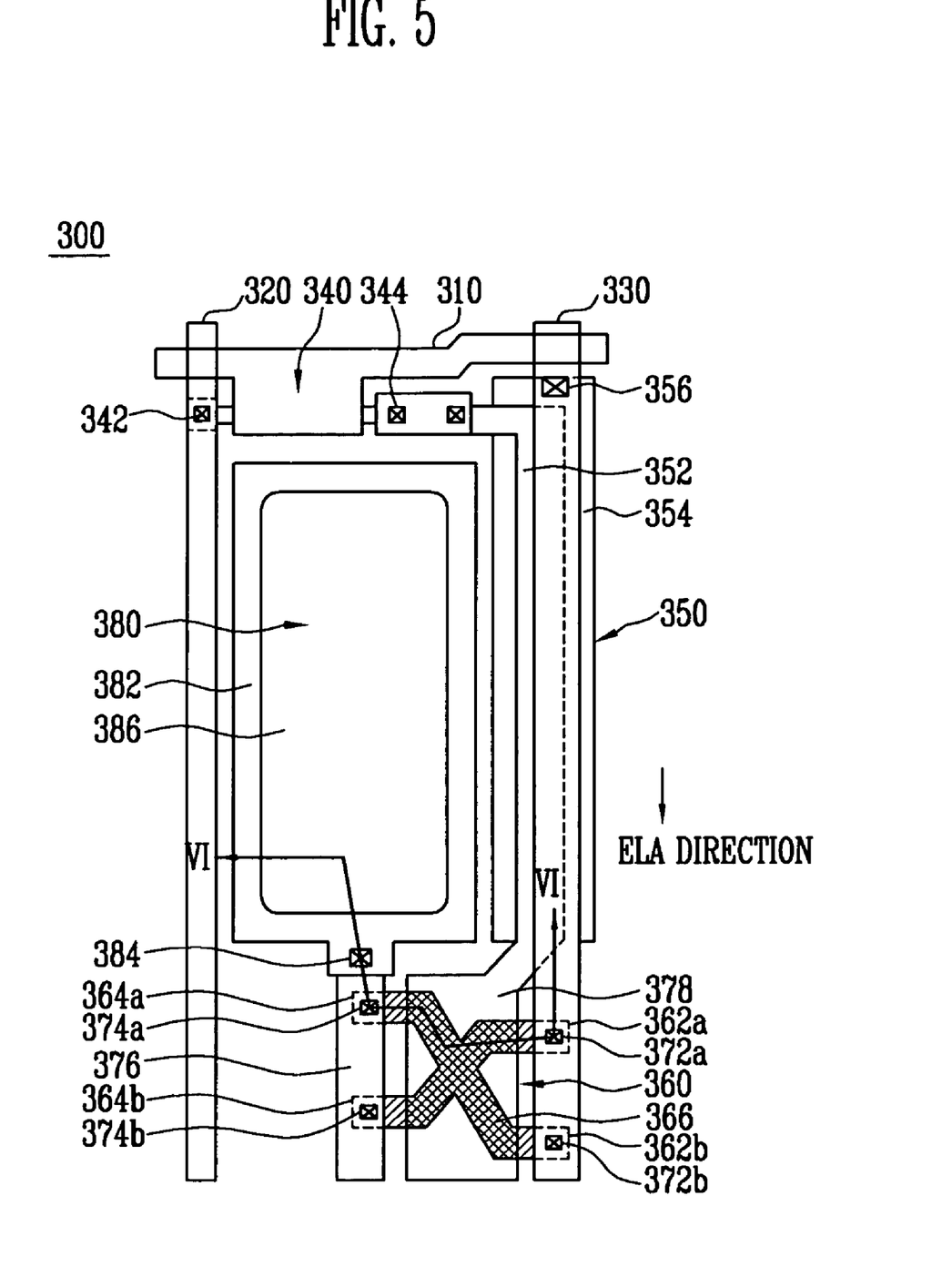
FIG. 5 is a layout diagram of one embodiment of a pixel of an organic light emitting diode display comprising a transistor.

FIG. 5 is a layout diagram of one embodiment of a pixel 300 of an organic light emitting diode display comprising a transistor similar to the transistor 100 of FIG. 2. Referring to FIG. 5, the pixel 300 is a basic element for displaying an image in the display device, wherein the pixel 300 comprises an electroluminescent (EL) device 380 and a pixel circuit for controlling the EL device 380. The pixel 300 comprises a first transistor 340, a capacitor 350, and a second transistor 360. The pixel 300 is connected to a first power source line 330 and a second power source line (not shown). The pixel 300 is configured to emit light in at a predetermined color and level corresponding to a data signal applied to a data line 320 in response to a scan signal applied to a scan line 310.

In one embodiment, the first and second transistors 340 and 360 are formed of p-type TFTs. Each of the first and second transistors 340 and 360 includes a gate, a source, and a drain. The capacitor 350 comprises a first electrode 352 and a second electrode 354.

In one embodiment, the first transistor 340 comprises a gate connected to the scan line 310, a source connected to the data line 320 through a first contact 342, and a drain connected to the first electrode 352 of the capacitor 350 through a second contact 344. The first transistor 340 samples the data signal applied to the data line 320 in response to the scan signal applied to the scan line 310.

The capacitor 350 comprises the first electrode 352 connected to both the drain of the first transistor 340 and the gate of the second transistor 360, and a second electrode 354 connected to the first power source line 330 through a third contact 356. In operation, the capacitor 350 stores a predetermined voltage corresponding to the data signal when the first transistor 340 is turned on, and maintains a voltage between the gate and the source of the second transistor 360 as the stored voltage when the first transistor 340 is turned off.

The second transistor 360 is implemented with a transistor such as the transistors 100, 100a-c described above and illustrated in FIGS. 2, 4A-C. Therefore, because the transistor 360 is configured to maintain a uniform current flow as described above, an organic light emitting diode display implementing the pixel 300 has improved picture quality.

In the embodiment illustrated in FIG. 5, the second transistor 360 comprises a channel 366 having a substantially X-shaped configuration, and first and second source regions 362a, 362b and first and second drain regions 364a, 364b connected to the ends of the channel 366. The first and second source regions 362a, 362b are connected to the first power source line 330 through fourth and fifth contacts 372a, 372b. Similarly, the first and second drain regions 364a, 364b are connected to a drain electrode 376 through sixth and seventh contacts 374a, 374b.

The second transistor 360 further comprises a gate 378 aligned with the channel 366, and an insulating layer interposed between the gate 378 and the channel 366. In operation, the second transistor 360 supplies a predetermined current to the EL device 380 in response to a voltage applied between the gate 378 and the source regions 362a, 362b, which are connected to the first and second electrodes 352, 354 of the capacitor 350, respectively.

The EL device 380 comprises an organic thin film 386, and a first electrode 382 and a second electrode (not shown) formed on both surfaces of the organic thin film 386. In one embodiment, the first electrode 382 is an anode electrode and the second electrode is a cathode electrode. In the pixel 300, the first electrode 382 is connected to the drain electrode 376 of the second transistor 360 through a sixth contact 384. The second electrode may be commonly connected to a cathode electrode of another EL device and may comprise indium tin oxide (ITO), for example.

The organic thin film 386 may have a multi-layer structure comprising a hole injecting layer and an electron injecting layer on either side of an emitting layer, wherein the emitting layer is formed of an organic material in order to improve the injection of electrons and holes from the anode electrode 382 and the cathode electrode. In addition, the organic thin film 386 may include an electron transporting layer, a hole transporting layer, and a hole blocking layer in order to improve the emitting characteristic of the EL device.

In the pixel 300 comprising the transistor 100 of FIG. 2, for example, despite formation of a defect in a specific portion of the channel of the transistor during the crystallizing process, the transistor current paths are formed in alternate parts of the channel. Thereby, it is possible to maintain overall uniform current flow, and therefore, it is possible to significantly improve uniformity in the characteristic of the driving transistor in a panel of a display device.

In one embodiment, the transistors in the pixel are formed of p-type transistors. However, the invention is not restricted to such a structure, wherein the transistors may be formed of n-type transistors, or a combination of p-type and n-type transistors. As will be appreciated by those skilled in the art, the pixel 300 may be implemented with other transistor configurations according to the invention, such as the transistors 100a, 100b, and 100c illustrated in FIGS. 4A-C.

Furthermore, the pixel may include a pixel circuit of configured for an alternative voltage programming structure, or a pixel circuit configured for a current programming structure. A pixel circuit configured for current programming structure is described below in reference to FIG. 7.

Figure 6:
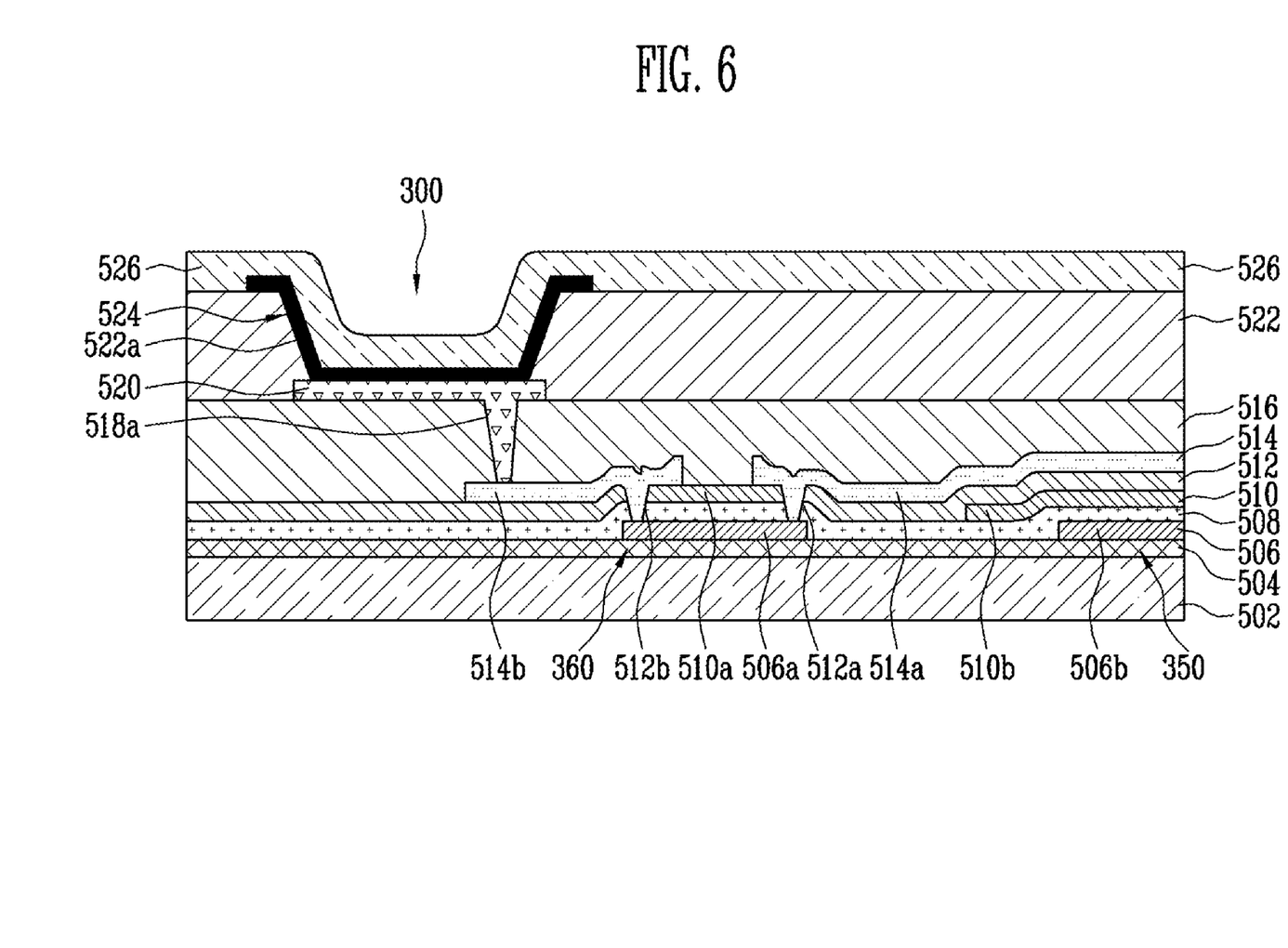
FIG. 6 is a sectional view taken along line VI-VI of FIG. 5.

FIG. 6 is a cross-sectional view of the pixel 300 taken along line VI-VI of FIG. 5. Referring to FIG. 6, a buffer layer 504 is formed on a substrate 502. The substrate 502 may comprise a glass substrate or an insulating transparent substrate, for example. In one embodiment, the buffer layer 504 is made of a nitride film or an oxide film. In some embodiments, the buffer layer 504 is formed of a silicon oxide film to a thickness of about 3,000 Å to prevent impurities, such as metal ions, from diffusing into a semiconductor layer, and in particular, into a channel. The buffer layer 504 may be formed by a chemical vapor deposition (CVD) method, for example.

The substrate 502 on which the buffer layer 504 is formed is coated with an amorphous silicon layer by a plasma enhanced chemical vapor deposition (PECVD) and is heated at the temperature of about 430° C. to remove the hydrogen component included in the amorphous silicon layer. Following the heating process, the dehydrogenated amorphous silicon layer is crystallized by a predetermined method to form a semiconductor layer 506. The semiconductor layer 506 comprises a first semiconductor layer portion 506a having a source region, a drain region, and a channel therebetween, and a second semiconductor layer portion 506b forming an electrode of the capacitor 350.

In one embodiment, the semiconductor layer 506 is crystallized by an excimer laser crystallization (ELC) or an excimer laser annealing (ELA) method. In the ELA method, a laser beam has a rectangular section whose length is about 200 mm to about 250 mm and whose width is about 0.25 mm to about 1.5 mm. In an embodiment wherein a display device has a panel with a large area, multiple laser beams irradiate an amorphous silicon film in an overlapping configuration in order to minimize a deviation in energy between areas which the laser beams irradiate in a process of poly-crystallizing the amorphous silicon film.

In some embodiments, the polycrystalline silicon layer may be formed of amorphous silicon by depositing intrinsic amorphous silicon to a thickness of about 500 Å in a low-pressure chemical vapor deposition (LPCVD) method to crystallize intrinsic amorphous silicon.

The semiconductor layer 506 is patterned according to a predetermined pattern with an etching process, comprising forming a photoresist mask on the semiconductor layer 506 and physical and chemical reactions. In the pixel 300, the first semiconductor layer portion 506a is patterned to have a substantially X-shaped geometry (see FIG. 2) and, at the same time, the second semiconductor layer portion 506b that forms an electrode of the capacitor 350 is also patterned.

Following the patterning of the semiconductor layer 506, a gate insulating layer 508 is formed on the substrate 502 over the semiconductor layer 506. A gate electrode material 510, such as aluminum, is deposited over the gate insulating layer 508, and the gate electrode material 510 is patterned to form a gate electrode 510a aligned with the channel of the first semiconductor layer portion 506a. A second electrode 510b of the capacitor 350 is also patterned simultaneously with the gate electrode 510a. After the gate electrode material 510 is patterned, impurity ions are injected into a predetermined region of the first semiconductor layer portion 506a using the gate electrode 510a as a mask. In one embodiment, the predetermined region of the first semiconductor layer portion 506a form the source and drain regions. The type of the injected impurity ions are determined by the type of a transistor. For example, phosphor (P) may be injected into an n-type thin film transistor and boron (B) may be injected into a p-type thin film transistor.

In some embodiments, the source and drain regions may have a lightly doped drain (LDD) structure obtained by primarily injecting low concentration impurity ions using the gate 510a as a mask, thereby forming low concentration source and drain regions. The process comprises covering the gate 510a and a uniform thickness from the gate 510a to the low concentration source and drain regions with a photoresist, and secondarily injecting high concentration impurity ions to form high concentration source and drain regions.

After formation of the source and drain regions, an inter-insulating layer 512 is formed on the above-described structure including the gate electrode 510a. First and second contact holes 512a, 512b are formed in the inter-insulating layer 512 to expose the source and drain regions, respectively. A metal layer 514 is deposited over substantially the entire surface of the pixel structure and is patterned to form a source and drain electrodes 514a, 514b. The source and drain electrodes 514a, 514b are connected to the source and drain regions through the first and second contact holes 512a, 512b, respectively. In addition, the source electrode 514a is connected to a power source line (not shown).

A planarization layer 516 comprising organic materials such as acryl, polyimide, and BCB is formed on the above-described pixel structure. The planarization layer 516 includes a third contact hole 518a that exposes the drain electrode 514b. In some embodiments, the planarization layer 516 is formed after formation of a passivation layer, comprising $SiO_2$ and SiNx, on the above-described pixel structure.

An anode electrode 520 is deposited on the planarization layer 516 to be patterned, and the anode electrode 520 is electrically connected to the drain electrode 514b through the third contact hole 518a. Next, a pixel defining layer 522 is formed on the above-described pixel structure. The pixel defining layer 522 includes an aperture 522a that exposes the anode electrode 520. An organic light emitting material 524 is deposited in the aperture 522a, and a cathode electrode 526 is formed over the organic light emitting material 524 and the pixel defining layer 522.

Thus, the pixel structure 300 of FIG. 6 comprises the transistor with the channel structure having multiple current transmission paths, the capacitor electrically connected between the gate and the source of the transistor, and the EL device controlled by the transistor and the capacitor.

The pixel 300 may include MOSFET transistors of a PMOS type or an NMOS type. In the pixel 300, the bottom electrode and the top electrode of the capacitor are formed simultaneously with the semiconductor layer and the gate electrode. Alternatively, the capacitor may be formed to include a bottom electrode formed in the same layer as the gate electrode, and the top electrode formed in the same layer as the source and drain electrodes.

Figure 7:
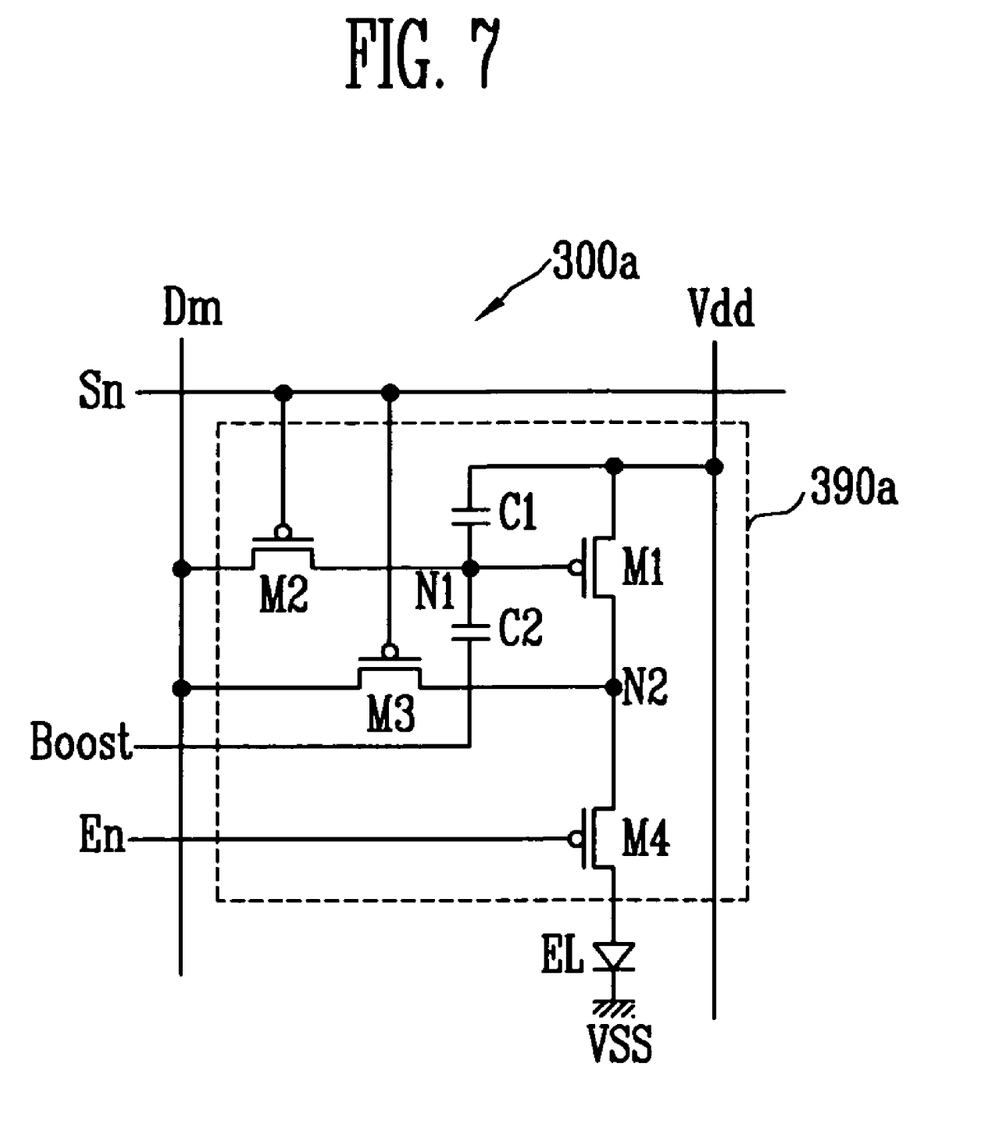
FIG. 7 is a circuit diagram of one embodiment of a pixel comprising a transistor.

FIG. 7 is a circuit diagram of a pixel 300a including a transistor according to embodiments of the invention. Referring to FIG. 7, the pixel 300a comprises an EL device, and a pixel circuit 390a for controlling the EL device. The pixel circuit 390a comprises first to fourth transistors M1, M2, M3, and M4 and first and second capacitors C1 and C2.

Each of the first to fourth transistors M1, M2, M3, and M4 includes a source, a drain, and a gate. The source and drain may be represented as first and second electrodes, respectively. Each of the first and second capacitors C1 and C2 include first and second electrodes.

The gate of the first transistor M1 is connected to a first node N1, and the source of the first transistor M1 is connected to a power source line configured to transmit a first pixel voltage VDD. The drain of the first transistor M1 is connected to a second node N2. The first transistor M1 is configured to supply current, corresponding to a voltage applied between the first and second electrodes of the first storage capacitor C1, to the EL device during a period where the fourth transistor M4 is turned on.

The first transistor M1 comprises an embodiment of the transistor described above, such as one of the transistors 100a, 100b, and 100c illustrated in FIGS. 4A-C. Accordingly, the first transistor M1 includes a semiconductor layer comprising source contacts and drain contacts arranged so as not to cross each other in the longitudinal direction of the rectangular section of a laser beam used for crystallizing the semiconductor layer. Thereby, in the event a defect is generated during the manufacturing process in a specific part of the semiconductor layer, such as the region where a source and/or drain is formed, the first transistor M1 has current paths between the remaining source(s) and drain(s) to provide uniform current flow.

Referring still to FIG. 7, the gate of the second transistor M2 is connected to a scanning line Sn, the source of the second transistor M2 is connected to a data line Dm, and the drain of the second transistor M2 is connected to the first node N1. The second transistor M2 is configured to transmit a data signal from the data line Dm to the first node N1 in response to a scan signal applied to the scan line Sn.

The gate of the third transistor M3 is connected to the scan line Sn, the source of the third transistor M3 is connected to the data line Dm, and the drain of the third transistor M3 is connected to the second node N2. The third transistor M3 diode is connected to the first transistor M1 in response to application of the scan signal to the scan line Sn.

The gate of the fourth transistor M4 is connected to an emission control line En, the source of the fourth transistor M4 is connected to the second node N2, and the drain of the fourth transistor M4 is connected to the EL device. The fourth transistor M4 is configured to selectively or restrictively supply current from the first transistor M1 to the EL device in response to an emission control signal applied to the emission control line En.

The first electrode of the first storage capacitor C1 is connected to the first node N1, and the second electrode of the first storage capacitor C1 is connected to the power source line supplying the first pixel voltage VDD. The first electrode of the first storage capacitor C1 is also connected to the gate of the first transistor M1 via the first node N1, and the second electrode of the first storage capacitor C1 is also connected to the source of the first transistor M1. The first storage capacitor C1 is configured to store a voltage corresponding to the threshold voltage of the first transistor M1 during a period when the second and third transistors M2 and M3 are turned on. The first storage capacitor C1 is also configured to store a voltage corresponding to the data current transmitted through the data line Dm during a period when the second transistor M2 is turned on. The first storage capacitor C1 maintains a voltage between the gate and source of the first transistor M1 as the stored voltage during a period when the second and third transistors M2 and M3 are turned off.

The first electrode of the second storage capacitor C2 is connected to the first node N1, and the second electrode of the second storage capacitor C2 is connected to a Boost line configured to provide a boost voltage. The second storage capacitor C2 boosts the gate voltage of the first transistor M1 to down scale current. Specifically, the second storage capacitor C2 is configured to increase a low voltage generated at the first node N1, due to the application of a large current, in accordance with the increase in the voltage of the boost line.

Thus, an active matrix OLED pixel including the transistor according to an embodiment of the invention, maintains uniform current flow in the transistor even when a defect is generated in a specific part of the channel of the driving transistor, such as a source or drain region of the transistor. Thereby, uniformity of operation is improved in the display panel driving transistors, resulting in improved picture quality.

Figure 8:
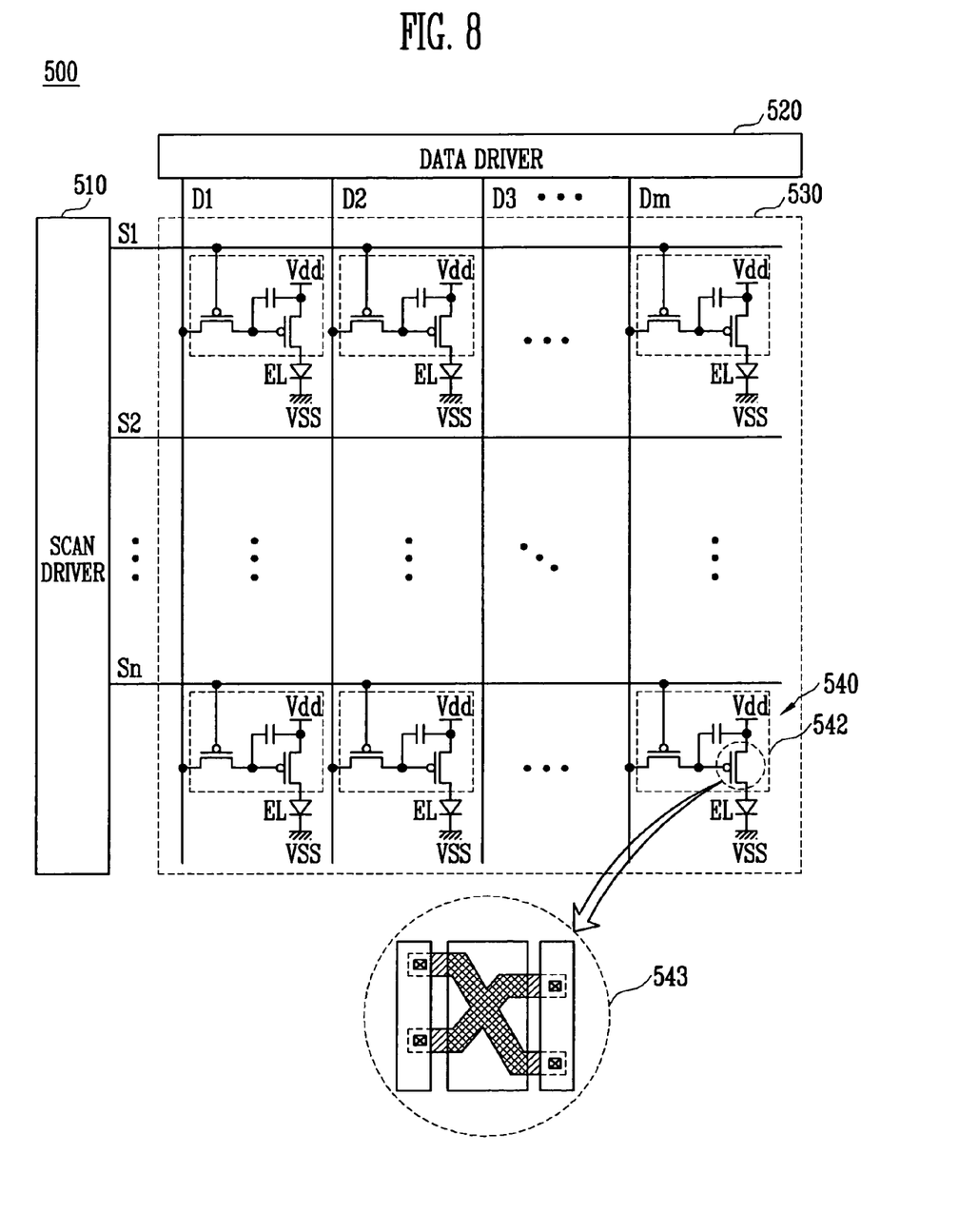
FIG. 8 is a schematic of one embodiment of an organic light emitting diode display comprising a transistor with channels formed therein.

FIG. 8 is a block diagram of an organic light emitting diode display (OLED) 500 including a transistor 543 according to an embodiment of the invention, such as the transistor 100 illustrated in FIG. 2. Referring to FIG. 8, the OLED 500 is configured to display an image by an active matrix driving method. The OLED 500 comprises a scan driver 510, a data driver 520, and an image display part 530. The image display part 530 comprises a plurality of pixels 540. Each of the pixels 540 includes an EL device, and a pixel circuit 542 for controlling the EL device. The pixel circuit 542 includes the driving transistor 543 according to an embodiment of the invention. FIG. 8 includes an enlarged view of the transistor 543.

The image display part 530 of the OLED 500 comprises n scan lines S1, S2, . . . Sn that extend from the scan driver 510 to the image display part 530 in a horizontal direction, m data lines D1, D2, D3, . . . Dm that extend from the data driver 520 to the image display part 530 in a vertical direction, and n×m pixels 540 connected to the scan lines and the data lines.

The scan driver 510 is configured to supply scan signals to the scanning lines S1, S2, . . . Sn. The scan signals are transmitted to the respective pixels 540 by one of a single scanning method, a progressive scanning method, a dual scanning method, an interlaced scanning method, and another scanning method.

The data driver 520 is configured to supply data signals to the data lines D1, D2, D3, . . . Dm, wherein the data signals include a data voltage. Alternatively, the data signals may include a data current in accordance with the structure of the pixel circuit.

The image display part 530 comprises a power source line (not shown) configured to transmit the first power source voltage VDD, the plurality of scanning lines S1, S2, . . . Sn, the plurality of data lines D1, D2, D3, . . . Dm, and the plurality of pixels 540. In one embodiment, the image display part 530 is formed on a substrate (not shown) such as an insulating transparent substrate.

In some embodiments, the scan driver 510 and/or the data driver 520 are directly mounted on the substrate on which the image display part 530 is formed. Alternatively, the scan driver 510 and/or data driver 520 may be replaced by a driving circuit formed at the same layers as the scanning lines, the data lines, and the transistor on the substrate on which the image display part 530 is formed. In other embodiments, the scan driver 510 and/or the data driver 520 have a chip-on-flexible board or chip-on-film (COF) structure. Specifically, the scan driver 510 and/or the data driver 520 may be mounted on a flexible printed circuit (FPC) or a film adhered to and electrically connected to the substrate in the form of chips.

The pixel 540 is configured to emit light with a predetermined color and brightness in accordance with the data signals transmitted through the data lines D1, D2, D3, . . . Dm. The pixel 540 comprises at least a switching transistor, capacitor, the driving transistor, and the EL device. As illustrated in FIG. 8, the driving transistor 543 is implemented with a transistor according to an embodiment of the invention. When the semiconductor layer of the driving transistor 543 is formed by a crystallizing process such as ELA, current paths can still be formed by between source and drain regions despite formation of a defect in one of the source and drain regions of the semiconductor layer of the driving transistor. Accordingly, uniformity in the driving transistor 543 of the OLED 500 is improved, thereby maintaining a uniform overall current flow. The improved uniformity in the driving transistors results in improved picture quality of the OLED 500.

Thus, embodiments of the invention improve uniformity in the transmission characteristic of pixel driving transistors despite deviations in the manufacturing processes. In addition, numerical aperture of the OLED can be improved because a circuit for compensating for the threshold voltage of the driving transistor can be omitted from the OLED. Furthermore, reduction of defects in the driving transistor provides for improved yield of the OLED. The picture quality of an OLED employing driving transistors with uniform transmission characteristics is also improved over conventional displays.

Embodiments of the invention described above include a transistor having a coplanar or top gate structure. However, the invention is not limited to such a structure and other structures are within the scope of the invention, such as a staggered structure and a bottom gate structure. Embodiments of the invention can be adapted to TFTs having various structures in which the positions of the source/drain electrode contact holes do not cross each other in the longitudinal direction of the laser beam used in the crystallizing process, and the channel includes a plurality of current transmission paths.

In some embodiments, the transistor may be formed of an active device that includes first, second, and third electrodes, wherein the active device is configured to control the amount of current flowing from the second electrode to the third electrode according to the voltage applied between the first and second electrodes.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. An organic light emitting diode display (OLED) comprising:
   an image display part comprising a plurality of pixels, each pixel comprising a driving transistor configured to control the driving of a pixel;
   a scan driver configured to transmit scan signals to scanning lines electrically connected to the plurality of pixels; and
   a data driver configured to transmit data signals to data lines electrically connected to the plurality of pixels,
   wherein the driving transistor comprises:
      a substrate;
      a semiconductor layer formed on the substrate, comprising:
         one or more source sections connected to first and second source contacts of a source electrode through first and second source contact holes, the first and second source contact holes substantially defining a source contact line;
         one or more drain sections connected to first and second drain contacts of a drain electrode through first and second drain contact holes, the first and second drain contact holes substantially defining a drain contact line; and
         a channel formed between the source contact line and the drain contact line, wherein the channel comprises one of:
            A) a channel region with a current path from only one source section to a plurality of drain sections; and
            B) a channel region with a current path from only one drain section to a plurality of source sections; and
      a gate electrode aligned with the channel and a gate insulating layer interposed between the gate electrode and the channel,
   wherein the first and second source contact holes and the first and second drain contact holes are arranged such that no line perpendicular to the source contact line intersects both a source contact hole and a drain contact hole.

2. The OLED as claimed in claim 1, wherein each pixel further comprises:
   a first transistor configured to transmit the data signals in response to the scan signals;

a capacitor configured to store a voltage corresponding to the data signals, wherein the driving transistor is configured to supply current in response to the voltage stored in the capacitor; and an electroluminescent (EL) device configured to emit light in response to the current.

3. The OLED as claimed in claim 1, wherein each pixel further comprises:

a first transistor including first and second transistor electrodes and a transistor gate, wherein the first transistor electrode is connected to the data lines, the second transistor electrode is connected to a first node, and the transistor gate is connected to the scanning lines;

a capacitor including first and second capacitor electrodes, wherein the first capacitor electrode is connected to the first node, and the second capacitor electrode is connected to a first power source line configured to supply a first pixel voltage, and wherein one of the source and drain electrodes of the driving transistor is connected to the first power source line, and the other of the source and drain electrodes is connected to a second node; and an EL device including first and second EL electrodes, wherein the EL first electrode is connected to the second node, and the second EL electrode is connected to a second power source line configured to supply a second pixel voltage.

4. The OLED as claimed in claim 1, wherein one of the source and drain electrodes of the driving transistor is connected to a first power source line configured to supply a first pixel voltage, and the other of the source and drain electrodes is connected to a second node, and wherein each pixel farther comprises:

a second transistor including a third electrode connected to the data lines, a fourth electrode connected to a first node, and a second transistor gate connected to the scanning lines;

a third transistor including a fifth electrode connected to the data lines, a sixth electrode connected to a second node, and a third transistor gate connected to the scanning lines;

a first capacitor including a seventh electrode connected to the first node and an eighth electrode connected to the first power source line;

a second capacitor including a ninth electrode connected to the first node and a tenth electrode connected to a boost line;

a fourth transistor including an eleventh electrode connected to the second node, a twelfth electrode, and a fourth transistor gate connected to an emission control line; and an EL device including a thirteenth electrode connected to the twelfth electrode of the fourth transistor and a fourteenth electrode connected to a second power source line configured to supply a second pixel voltage.

5. The OLED as claimed in claim 1, wherein the channel extends between at least one of the first and second source contacts and at least one of the first and second drain contacts.

6. The OLED as claimed in claim 1, wherein one of a first distance between the first and second source contacts is different than a second distance between the first and second drain contacts.

7. The OLED as claimed in claim 1, wherein at least one of the source sections or at least one of the drain sections is connected to one of the source electrode and the drain electrode through a fifth contact.

8. The OLED as claimed in claim 1, wherein at least one of the source sections and at least one of the drain sections are respectively connected to the source electrode and the drain electrode through at least a third source contact hole and at least a third drain contact hole, respectively.

9. The OLED as claimed in claim 1, wherein the semiconductor layer is a polysilicon layer formed by a process of crystallizing an amorphous silicon layer.

10. The OLED as claimed in claim 1, wherein the semiconductor layer is a polysilicon layer formed by an excimer laser annealing process.

* * * * *